United States Patent [19]

Ikeguchi

[11] 4,220,922

[45] Sep. 2, 1980

[54] PRESET TUNER

[75] Inventor: Shigehiko Ikeguchi, Gunma, Japan

[73] Assignees: Sanyo Electric Co. Ltd., Moriguchi; Tokyo Sanyo Electric Co., Ltd., Gunma, both of Japan

[21] Appl. No.: 870,670

[22] Filed: Jan. 18, 1978

[30] Foreign Application Priority Data

Jan. 25, 1977 [JP] Japan .................................. 52-8290

[51] Int. Cl.$^2$ ............................................. H04B 1/26
[52] U.S. Cl. .................................... 455/182; 455/186
[58] Field of Search ............... 325/421, 423, 453, 459, 325/464, 468, 470; 358/191, 195

[56] References Cited

U.S. PATENT DOCUMENTS

| | | | |
|---|---|---|---|
| 2,771,546 | 11/1956 | Schock | 325/421 |
| 3,906,351 | 9/1975 | Evans | 325/464 |
| 3,936,753 | 2/1976 | Clark | 325/470 |
| 3,968,440 | 7/1976 | Ehni | 325/464 |
| 4,023,116 | 5/1977 | Alfke et al. | 325/421 |
| 4,085,371 | 4/1978 | Mogi et al. | 325/464 |
| 4,123,718 | 10/1978 | Wine | 325/464 |

OTHER PUBLICATIONS

Digital TV Tuner Uses MOS LSI and Non-Volatile Memory-Lester Penner, General Instrument Corp., Apr. 1, 1976, pp. 86–90.

Primary Examiner—Marc E. Bookbinder
Attorney, Agent, or Firm—Darby & Darby

[57] ABSTRACT

A preset tuner adapted for selecting a desired one out of a plurality of preset channels, comprising: a memory for storing digital data concerning a plurality of channels to be preset, push-buttons for addressing the memory for reading the digital data of a desired channel, a digital-/analog converter for converting the read digital data into an analog signal, a manually operable variable voltage generator, a write-in/channel select mode selector, a switch circuit responsive to the mode selector switchable between the digital/analog converter and the variable voltage generator, a voltage controlled oscillator responsive to the output of the switch circuit, a tuner employing the voltage controlled oscillator as a local oscillator, a comparator for comparing the outputs of the digital/analog converter and the variable voltage generator, a counter to be reset responsive to the push-button and to be enabled responsive to the write-in mode output of the mode selector to make a counting operation as a function of the output of the comparator, the output of the counter being loaded as the digital data concerning a channel in the memory, as addressed, a reference oscillator, a frequency comparator for comparing the output of the reference oscillator and the intermediate frequency output of the tuner, a filter for filtering the frequency comparator output to provide a correction control signal to the digital/analog converter, the digital/analog converter being adapted to be corrected for deviation of the intermediate frequency of the tuner as a function of the correction control signal.

22 Claims, 12 Drawing Figures

PRESET TUNER

BACKGROUND OF THE INVENTION

1. Field of the Invention

The present invention relates to a preset tuner. More specifically, the present invention relates to an improved preset tuner adapted for presetting a plurality of channels by storing digital data concerning the local oscillation frequencies corresponding to the respective channels.

2. Description of the Prior Art

A typical conventional preset tuner such as employed in car radio receivers and the like comprises a mechanical preset scheme. For example, such a preset tuner employing variable inductance devices as a tuning element is adapted to preset a plurality of channels by varying the inductance value of the variable inductance devices in association with the manual operation of a tuning knob. Another example of such a tuner using a variable capacitance device such as a variable capacitance diode as a tuning element employs variable resistors adjustable in association with the manual operation of a tuning knob for the purpose of a presetting operation.

Such preset tuners as described above as employing a variable inductance device, a variable capacitance device and the like require provision of the same number of variable inductance devices, variable resistors and the like as that of presetting channel selection switches, which makes the tuner large in size, with the result that such tuner is disadvantageous particularly in case where such tuner is employed in an indash type car radio receiver, where the tuner is provided in a limited space.

In addition, the above described conventional preset tuners comprise many mechanical and movable parts, which makes the tuner disadvantageous from the standpoint of the life and stability of operation as well as cost.

SUMMARY OF THE INVENTION

Briefly described, the present invention comprises a preset tuner adapted for selecting a desired one out of a plurality of preset channels, comprising storage means for storing a plurality of digital data representations each associated with one of said plurality of preset channels, means coupled to said storage means for providing to said storage means said digital data representations, means coupled to said storage means for selectively reading a desired one of said plurality of digital data representations from said storage means, means coupled to said reading means for converting said selectively read digital data representation into an analog signal associated with said read digital data representation, voltage controlled oscillator means coupled to said analog signal converting means for for producing an oscillation signal at a frequency associated with said converted analog signal, means for receiving a high frequency signal, and mixer means coupled to said high frequency signal receiving means and said voltage controlled oscillator means for mixing said received high frequency signal and said oscillation output from said voltage controlled oscillator means for providing an intermediate frequency signal, characterized in that the inventive preset tuner further comprises means coupled to said mixing means and responsive to said intermediate frequency signal for detecting any frequency deviation of said intermediate frequency signal from a given intermediate frequency for providing a signal representative of the frequency deviation of said intermediate frequency signal and means coupled to said frequency deviation signal providing means and said analog signal converting means and responsive to said frequency deviation signal for compensating said analog signal, whereby said frequency deviation of said intermediate frequency signal is corrected.

Accordingly, a principal object of the present invention is to provide an improved preset tuner, wherein the data concerning the local oscillation frequencies corresponding to the respective preset channels is preloaded in a memory in a digital representation format.

Another object of the present invention is to provide an improved preset tuner, which is adapted for implementation by large scale integration integrated circuits.

A further object of the present invention is to provide an improved preset tuner, which is adapted for implementation in an electronic structure rather than mechanical structure.

Still another object of the present invention is to provide an improved preset tuner, which is of relatively small size and of stable performance.

Still a further object of the present invention is to provide an improved preset tuner, which can be implemented at a reduced cost.

Still a further aspect of the present invention is to provide an improved tuner, wherein a problem of temperature drift is eliminated.

An essential aspect of the present invention is a provision of a voltage correcting circuit for eliminating the necessity of a complicated control circuit in a preset tuner wherein the digital data concerning the local oscillation frequencies corresponding to the respective preset channels is preloaded in a memory.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
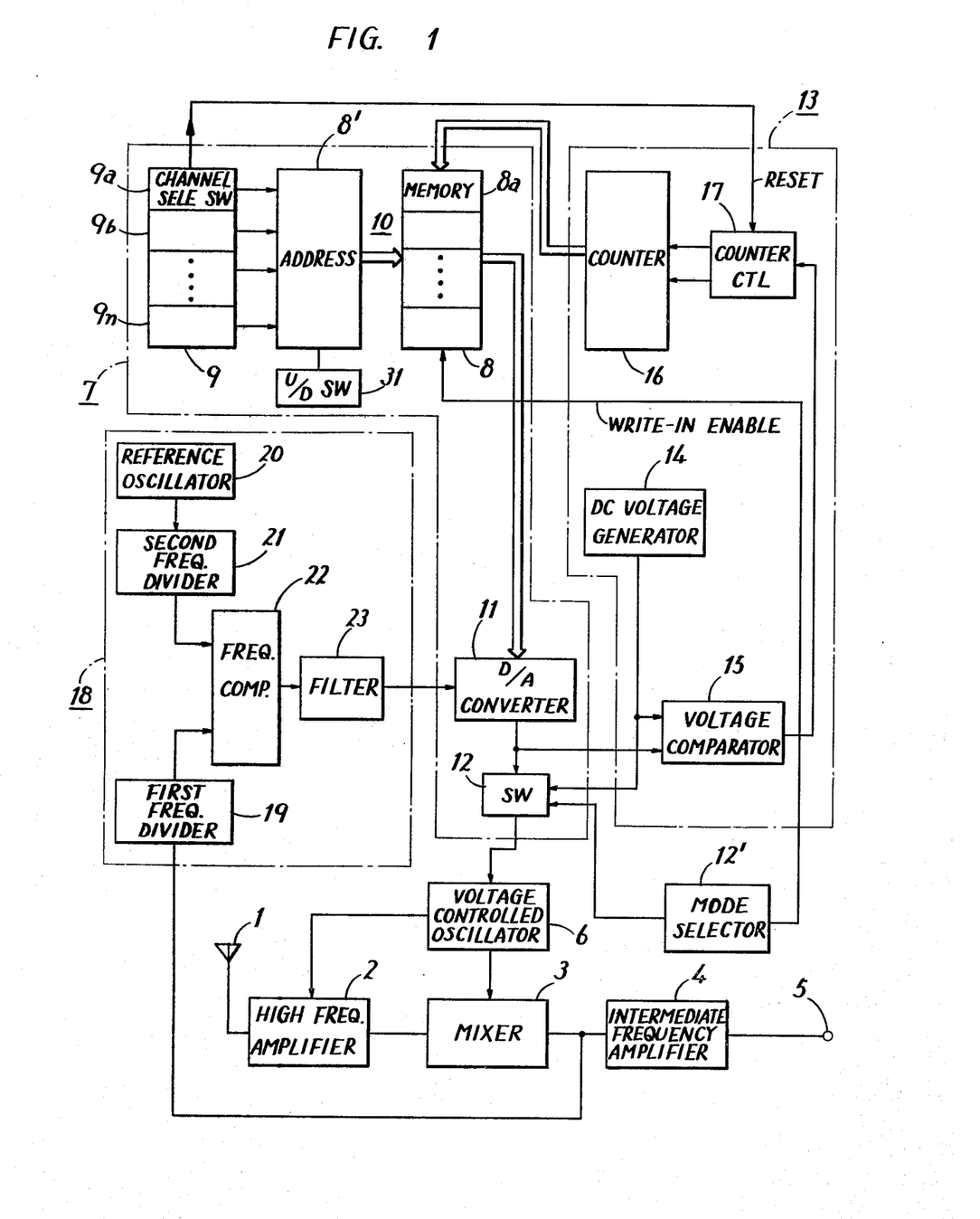
FIG. 1 shows a block diagram of one embodiment of a preset tuner in accordance with the present invention.

FIG. 1 shows a block diagram of one embodiment of the inventive preset tuner. Referring to FIG. 1, the preset tuner shown basically comprises a high frequency amplifier 2 for selectively amplifying a high frequency signal transmitted by a broadcasting station 10 and received by an antenna 1, a mixer for mixing the amplified high frequency signal from the high frequency amplifier 2 with a local oscillation signal for converting the high frequency signal into an intermediate frequency signal, an intermediate frequency amplifier 4 for amplifying the intermediate frequency signal from the mixer 3 and coupled to a signal output terminal 5 for transmission of the signal to a subsequent stage detecting circuit, not shown, and a voltage controlled oscillator 6 used as a local oscillator. As well known, a voltage controlled oscillator is adapted to be responsive to a voltage control signal for producing a signal at a frequency associated with the magnitude of the voltage control signal. According to the present invention, such voltage control signal is obtained from the inventive preset circuit 7 which is operatively coupled to a write-in circuit 13 and a voltage correcting circuit 18, as to be more fully described subsequently.

The preset circuit 7 comprises a storage circuit 10 comprising a channel selecting switch 9 including a plurality of preset push-buttons 9a, 9b, 9c, . . . 9n, a memory 8 for storing a plurality of digital data representations representative of the local oscillation frequencies corresponding to the channels to be preset, and an addressing circuit 8' for addressing a desired address in the memory 8 through operation of the channel selecting switch 9. The preset circuit 7 further comprises a voltage controllable digital/analog converting circuit 11 for converting a digital data signal obtainable from the storage circuit 10 into an analog signal as controlled as a function of a control signal and a switch circuit 12 for selectively feeding the analog converted output of the digital/analog converter 11 or a variable direct current voltage signal from the write-in circuit 13 to the voltage controlled oscillator 6 as a voltage control signal.

For the purpose of selecting a write-in mode and a channel select mode, a write-in/channel select mode selector 12' is provided and the switch circuit 12 is structured to be responsive to the mode selector 12' to be switchable between the output of the digital/analog converting circuit 11 and the output of the write-in circuit 13. More specifically, the switch circuit 12 is switched to the output of the digital/analog converting circuit 11 responsive to the channel select mode output of the mode selector 12' and is switched to the output of the write-in circuit 13 responsive to the write-in mode output of the mode selector 12'. The write-in/channel select mode selector 12' is also structured to provide a write-in enable signal in the write-in mode to the memory 8.

The write-in circuit 13 comprises a variable direct current voltage generator 14 which may typically comprise a manually operable variable resistor for voltage setting, a voltage comparator 15 adapted for comparing the direct current voltage of the variable direct current voltage generator 14 and the direct current output voltage of the digital/analog converter 11, a counter 16 for providing the count output as a variable digital data signal to the storage circuit 10, and a counter control 17 adapted for controlling the counter 16. The counter 16 is adapted to be reset responsive to a reset signal to be generated by the counter control 17 responsive to the operation of the push-button switch 9 and is also adapted to be enabled to make a counting operation responsive to the clock signal obtainable from the counter control 17.

The voltage correcting circuit 18 comprises a first frequency divider 19 for frequency dividing the intermediate frequency signal obtained from the mixer 3, a reference oscillator 20 for providing a reference frequency signal, a second frequency divider 21 for frequency dividing the reference frequency signal of the reference oscillator 20, a frequency comparator 22 for comparing the frequencies or the phases of the first and second frequency dividers 19 and 21, and a low-pass filter 23 for detecting a direct current component of the output from the frequency comparator 22 for providing the direct current component to the digital/analog converter 11 as a correction control signal. To that end, the digital/analog converter 11 is structured to be responsive to the correction control signal to be controlled of the converted analog output signal for the purpose of compensation or correction, as to be more fully described subsequently.

The operation of the major portion of the inventive preset tuner is substantially the same as that of an ordinary preset tuner, although the voltage controlled oscillator 6 has been employed as a local oscillator in the inventive tuner, as different from an ordinary tuner. The high frequency signal as received by the antenna 1 is selectively amplified by the high frequency amplifier 2 and the amplified high frequency signal is applied to the mixer 3. The amplified high frequency signal from the high frequency amplifier 2 is mixed by the mixer 3 with the local oscillation output signal from the voltage controlled oscillator 6, whereby the high frequency signal is converted into an intermediate frequency signal. The intermediate frequency signal thus obtained is amplified by the intermediate frequency amplifier 4 and is then withdrawn from the output terminal 5 to the subsequent stage circuits. The frequency of the intermediate frequency signal is 10.7 MHz in case of an FM radio tuner and 455 KHz in case of an AM radio tuner.

Now the operation in the write-in or preset mode will be described. The digital data concerning the local oscillation frequencies corresponding to the channels to be preset is loaded in the storage circuit 10 by means of the write-in circuit 13. To that end, first the write-in/channel select mode selector 12' is turned to the write-in mode, so that the switch 12 is turned to the output of the variable direct current voltage generator 14. Then the voltage controlled oscillator 6 is supplied not with the output of the digital/analog converting circuit 11 but the output of the variable direct current voltage generator 14. In such a situation manual operation of the variable resistor constituting the above described variable direct current voltage generator 14 causes variation of a voltage control signal to be supplied to the voltage controlled oscillator 6, which makes it possible to detect a completed tuning state to a desired channel or broadcasting station by means of a sound from a speaker, indication by a signal meter, a tuning meter, and the like. If and when a desired channel or broadcasting station is found, one button switch, for example the first preset button 9a, of the selection switch 9 is depressed, whereby the addressing circuit 8' is enabled, and one address, say the first address 8a, of the memory 8 is addressed. On the other hand, when the selection switch 9 is operated, the reset signal is obtained from the counter control 17 to the counter 16. As a result, a counting operation is initiated in the counter 16 starting from the reset state. The count output of the counter 16 is applied through the first address 8a of the memory 8 in the storage circuit 10 to the digital/analog converting circuit 11 in a digital data representation format and is converted into an analog signal associated with the value represented by the digital value developed by the counter 16. The analog converted signal from the converting circuit 11 is applied to one input of the voltage comparator 15. At the same time, the direct current voltage obtained from the variable direct current voltage generator 14 is also applied to the other input of the voltage comparator 15. As a result, voltage comparison is made of these two direct current voltages by the voltage comparator 15. The voltage comparator 15 is structured such that the same does not provide a write-in disable signal to the counter control 17 until the output voltage of the digital/analog converter 11 comes to coincide with or exceed the output voltage of the variable direct current voltage generator 14. Therefore, the counter 16 continues a counting operation until the output voltage of the digital/analog converting circuit 11 comes to coincide with or to exceed the the output voltage of the variable direct current voltage generator 14 and a write-in disable signal is obtained. While the counting operation is continued in the counter 16, the direct current voltage obtained from the digital/analog converting circuit 11 to the voltage comparator 15 approaches the direct current output voltage of the variable direct current voltage generator 14 and a write-in disable signal is obtained from the voltage comparator 15 upon coincidence of the output voltage of the digital/analog converting circuit 11 with the output voltage of the variable direct current voltage generator 14. Therefore, the counting operation is discontinued in the counter 16, when the digital data concerning the local oscillation frequency corresponding to the desired channel or the desired broadcasting station is loaded in the first address 8a of the memory 8.

Thereafter substantially the same operation is repeated for the other addresses in the memory 8 with respect to different desired channels or broadcasting stations. If and when one or more channels or broadcasting stations are written in the memory 8, the write-in/channel select mode selector 12' is turned to the channel select mode. Accordingly, the switch 12 is turned to the output of the digital/analog converting circuit 11. Thus the operation mode is changed from the write-in mode to the channel select mode.

For the purpose of channel selection in accordance with the present invention, a desired one button of the channel selection switch 9 is depressed. Assuming that the first preset button 9a is depressed, for example, then the first address 8a of the memory 8 is addressed by means of the addressing circuit 8' and the digital data stored in the first address 8a is read out and is applied to the digital/analog converting circuit 11. Since the write-in/channel select mode selector 12' has been turned to the channel select mode in such a situation, the memory 8 is not supplied with a write-in enable signal from the selector 12' and the data in the counter 16 is prevented from being loaded into the memory 8 any more. The digital data obtained from the first address 8a is converted by the digital/analog converting circuit 11 into a direct current signal associated with the value represented by the said digital data and the converted analog or direct current signal is applied through the switch circuit 12 to the voltage controlled oscillator 6 as a voltage control signal. As a result, the voltage controlled oscillator 6 oscillates at a local oscillation frequency corresponding to the channel or the broadcasting station stored in the first address 8a as a digital data signal. At the same time, the direct current signal from the switch circuit 12 is applied directly or through the voltage controlled oscillator 6 to the high frequency amplifier 2, where the direct current signal is applied to a voltage controlled device such as a voltage controlled variable capacitance diode provided therein as a control signal. As a result, the high frequency signal of the channel or the broadcasting station as stored in the first address 8a is selectively amplified by the high frequency amplifier 2 and is mixed with the local oscillation signal from the voltage controlled oscillator 6, with the result that a desired intermediate frequency signal is obtained.

If a digital/analog converter of high precision is utilized as the converting circuit 11, a precise analog signal is obtained and thus a precise voltage control signal is provided to the voltage controlled oscillator 6, resulting in a precise intermediate frequency signal. However, in view of temperature drift and the like, it is difficult to enhance the precision of the digital/analog converter and even if such a digital/analog converter of high precision is available, the cost would become high. Therefore, according to an aspect of the present invention, it is adapted such that a local oscillation signal of a precise value is obtained from the digital/analog converting circuit 11, without the need for enhancing the precision of the digital/analog converter, but instead by means of a voltage correcting circuit 18 for correcting the direct current voltage to be applied to the voltage controlled oscillator 6. To that end, a digital/analog converter which is controllable as a function of a correction control signal is employed as the digital/analog converting circuit 11. Such a correction control signal is obtained by the above mentioned voltage correcting circuit 18.

Referring to FIG. 1, the voltage correcting circuit 18 comprises a reference oscillator 20, which may comprise a crystal oscillator which is capable of providing a precise oscillation frequency signal. In consideration of the cost, the reference oscillator 20 may preferably produce a high oscillation frequency. Assuming that the tuner is an AM tuner, then the intermediate frequency signal is of 455KHz. If the oscillation frequency of the reference oscillator 20 is selected to be 3.64MHz, the frequency division rate of the first frequency divider 19 is selected to be 1/16 and the frequency division rate of the second frequency divider 21 is selected to be 1/128 and a proper intermediate frequency signal has been obtained, then the output signal frequencies of both frequency dividers 19 and 21 are equally 28.437KHz. In such a situation, no output signal is obtained from the frequency comparator 22 and no correction control signal is obtained from the low-pass filter 23 to the digital/analog converting circuit 11. On the other hand, assuming that the operation state of the digital/analog converting circuit 11 is varied by virtue of a temperature drift and the like and the output signal frequency of the voltage controlled oscillator is changed accordingly, then the intermediate frequency also changes to deviate from 455KHz. Then the output signal frequency of the first frequency divider 19 comes to differ from the output signal frequency of the second frequency divider 21, whereby an error signal is obtained from the frequency comparator 22 in association with the frequency difference. A direct current component of the error signal is extracted by means of the low-pass filter 23 and is applied to the digital/analog converting circuit 11 as a correction control signal.

Figures 2, 3:
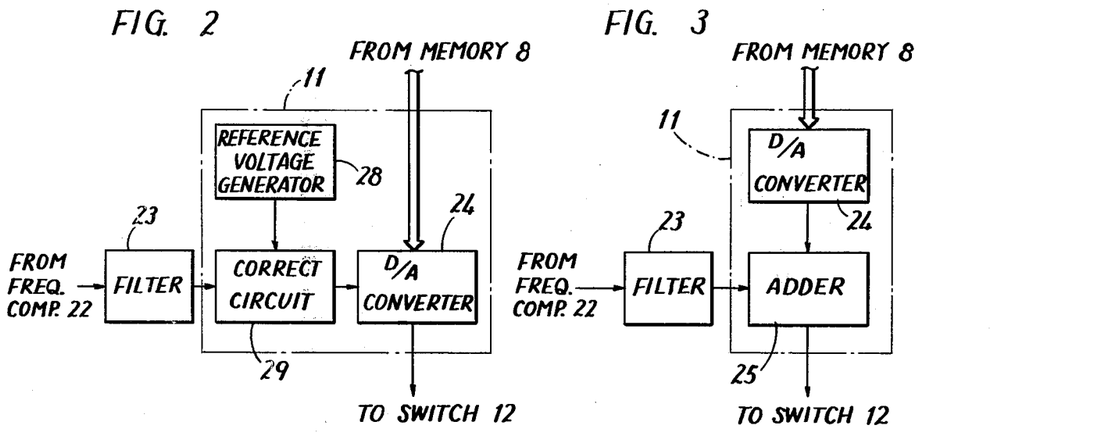
FIG. 2 shows a block diagram of one embodiment of the digital/analog converter of FIG. 1.
FIG. 3 shows a block diagram of another embodiment of the digital/analog converter of FIG. 1.

FIG. 2 shows a block diagram of one embodiment of a digital/analog converter which is controllable as a function of a correction control signal. Referring to FIG. 2, the converting circuit 11 comprises a reference voltage generator 28, a correcting circuit 29 responsive to the correction control signal from the low-pass filter 23 for correcting the reference voltage level from the reference voltage generator 28 for providing a corrected reference voltage, and a digital/analog converter 24 which is operable responsive to a corrected reference voltage. Since the digital/analog converting circuit 11 is structured as described above, the analog converted signal from the converting circuit 11 is corrected for the frequency difference and thus the output signal frequency of the voltage controlled oscillator 6 is also corrected, with the result that the frequency of the intermediate frequency signal is returned to 455KHz. If a reference oscillator 20 of oscillation frequency of 455KHz is readily available, then the first and second frequency dividers 19 and 21 can be dispensed with.

FIG. 3 shows a block diagram of another embodiment of the digital/analog converting circuit 11 which is controllable as a function of a correction control signal. Referring to FIG. 3, the converting circuit 11 comprises a digital/analog converter 24 and a voltage correcting circuit 25. The voltage correcting circuit 25 comprises an adder adapted for adding a direct current error voltage from the low-pass filter 23 to the output direct current voltage of the digital/analog converter 24, thereby to provide a proper direct current voltage. According to the FIG. 3 embodiment, the converting circuit 11 is adapted such that a larger output direct current voltage is obtained from the digital/analog converter 24, which is corrected as a function of an error voltage from the low-pass filter 23 for the purpose of fine adjustment.

As described previously, for the purpose of channel selecting operation, simply a desired switch of the channel selection switch 9 is operated. Then the corresponding address is selected and the digital data stored therein is read out and is converted into an analog signal, which is applied to the voltage controlled oscillator 6 as a voltage control signal, after correction as described above. As a result, a desired channel or broadcasting station corresponding to the depressed botton switch is selected. If reception of another channel or broadcasting station as preset is desired in such a situation, then simply the corresponding preset button switch, say preset switch button 9b, for example, may be depressed.

Figure 4:
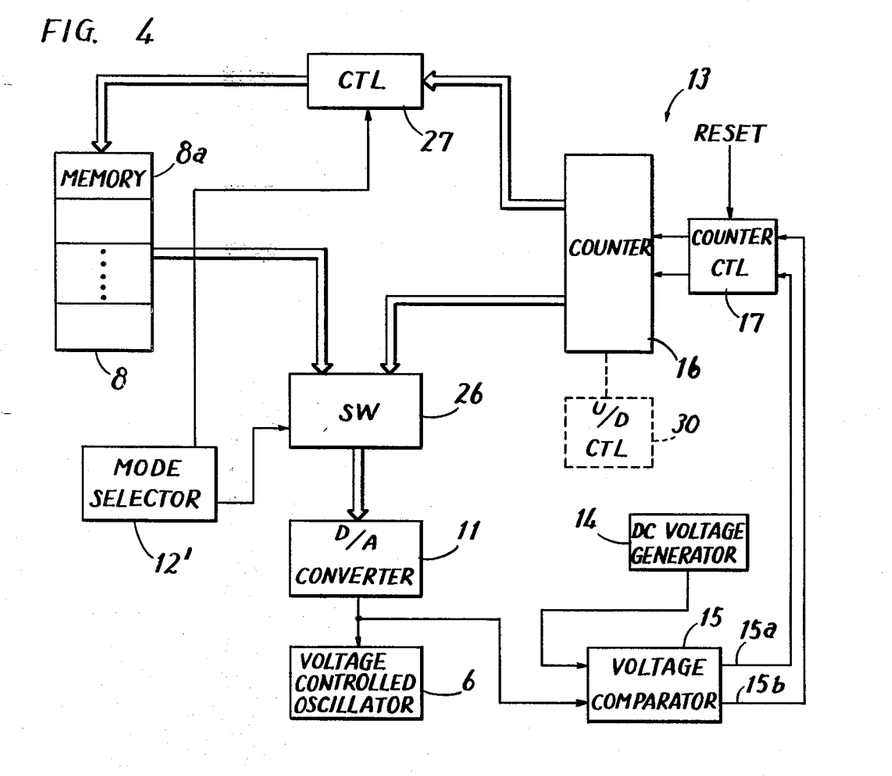
FIG. 4 shows a block diagram of another embodiment of the write-in circuit seen in FIG. 1.

FIG. 4 shows a block diagram of another embodiment of the write-in circuit 13. Referring to FIG. 4, a memory 8, a digital/analog converting circuit 11, a voltage controlled oscillator 6, a variable direct current voltage generator 14, a voltage comparator 15, a counter control 17, a counter 16 and a write-in/channel select mode selector 12' may be substantially the same as those described in the FIG. 1 embodiment. The features to be noted in the FIG. 4 embodiment are a switch circuit 26 provided for switching the signals to be applied to the digital/analog converting circuit 11, and a write-in enable control 27 provided between the counter 16 and the storage circuit 10. The switch circuit 26 is coupled to the write-in/channel select mode selector 12' such that the switch circuit 26 produces the output of the counter 16 in the write-in mode and produces the output of the memory 8 in the channel select mode.

In operation, first let it be assumed that the write-in/channel select mode selector 12' is turned to the write-in mode and the switch circuit 26 is operated to produce the output of the counter 16. When the variable direct current voltage generator 14 is manually operated in such a situation, then a closed loop including the blocks 16, 26, 11, 15, and 17 is controlled such that the direct current output signal voltage from the digital/analog converting circuit 11 may follow the output voltage of the variable direct current voltage generator 14. More specifically, assuming that the output voltage of the variable direct current generator 14 is larger than the output voltage of the digital/analog converting circuit 11, then the voltage comparator 15 provides a first output signal from a first output terminal 15a to the counter control 17, thereby to cause an up count operation in the counter 16 and the output digital signal of the counter 16 is successively converted into an analog signal or a direct current signal by the digital/analog converting circuit 11, which is then applied to the voltage comparator 15. The comparing operation by the voltage comparator 15 is continued, until the output voltage of the digital/analog converting circuit 11 increases to coincide with or slightly exceed the output voltage of the variable direct current voltage generator 14. If and when both input voltages of the voltage comparator 15 come to coincide with each other, no output signal is obtained from the first output terminal 15a any longer, whereby the up count operation in the counter 16 is discontinued. Now assuming that the output voltage of the variable direct current voltage generator 14 is smaller than the output voltage of the digital/analog converting circuit 11, then a second output signal is obtained from a second output terminal 15b of the voltage comparator 15, which is applied to the counter control 17 to enable the same to reset the counter 16. Then the voltage applied from the digital/analog converting circuit 11 to the voltage comparator 15 becomes zero and becomes smaller than the output voltage of the variable direct current voltage generator 14. As a result, the first signal is again obtained from the first output terminal 15a of the voltage comparator 15 and the above described closed loop operation is carried out. Since the above described closed loop operation is instantaneously completed, the manual operation of the variable direct current voltage generator 14 is immediately followed by the output voltage of the digital/analog converting circuit 11.

When the first preset button 9a shown in FIG. 1 is depressed after a desired channel or the broadcasting station is found through manual operation of the variable direct current voltage generator 14 and the counting operation in the counter 16 is discontinued, the write-in control 27 is operated and the count value or digital data developed in the counter 16 is written in the first address 8a of the memory 8. The data concerning other channels or broadcasting stations is similarly written in other addresses in the memory 8. After all the data concerning the desired channels or broadcasting stations is written in, the write-in/channel select mode selector 12' is turned to the channel select mode and the switch circuit 26 is accordingly turned to the output of the memory 8, so that the output from the memory 8 may be transferred through the switch circuit 26 to the digital/analog converter 11, while the write-in enable signal from the mode selector 12' to the write-in control 27 is interrupted.

Referring to FIG. 4, if an up/down counter is employed as the counter 16 and an up/down control 30 is provided, then the variable direct current voltage generator 14, the voltage comparator 15 and the counter control 17 can be dispensed with, with the result that the embodiment shown can be simplified in circuit configuration. More specifically, the up/down counter can be adjusted by operation of the up/down control 30 to achieve a desired adding or subtracting counting operation. Therefore, a desired presetting operation can be achieved simply by operating the up/down control 30 to set a desired value in the counter 16, which is then loaded in the memory 8.

In order to read out the data from the memory 8 in the storage circuit 10, the switch circuit 26 is turned from the output of the counter 16 to the output of the memory 8 through manual operation of the write-in/channel select mode selector 12'.

Referring again to FIG. 1, the addressing circuit 8' in the storage circuit 10 may comprise an up/down counter, which is operatively coupled to an up/down control switch 31, which enables successive reading of the data concerning the channels or broadcasting stations stored in the memory 8. More specifically, manual operation of the up/down control switch 31 causes sequential addressing of the memory 8 in the order of the first address, the second address, and so on. Thus, according to such embodiment, a preset automatic search operation can be achieved. The preset buttons 9a, 9b, 9c, ... 9n of the selection switch 9 in FIG. 1 may comprise push-button switches, touch switches and the like. Although the present invention is described as embodied in an AM tuner in the foregoing, it is pointed out that the present invention can be equally embodied in an FM tuner, in which case the intermediate frequency is 10.7MHz and therefore the frequency division rates of the first and second frequency dividers 19 and 21 must be properly selected to that end. If the present invention is embodied in an FM/AM tuner, two reference oscillators 20 are preferably provided, such that either is selectively switched, or alternatively a single reference oscillator 20 is commonly utilized by controllably changing the frequency division rate thereof. In case of the above described FM/AM tuner, each preset button of the selection switch 9 may be utilized for two addresses of the FM and AM bands by properly providing a selection switch therefor, so that the number of preset buttons of the selection switch 9 may be reduced.

Figure 5:
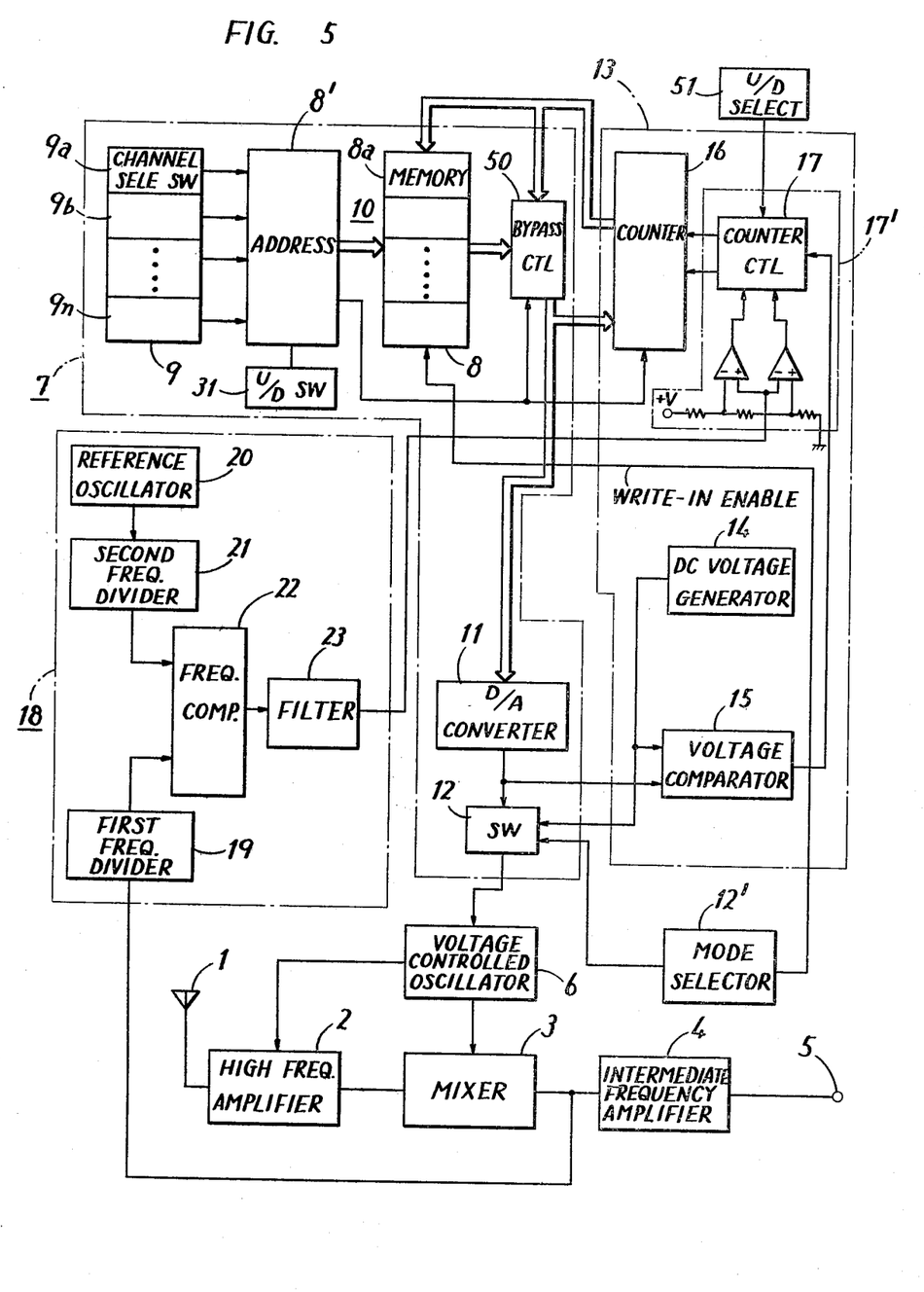
FIG. 5 is similar to FIG. 1 but shows a block diagram of another embodiment of a preset tuner in accordance with the present invention.

FIG. 5 is similar to FIG. 1 but shows a block diagram of another embodiment a preset tuner in accordance with the present invention. Since the major portion of the FIG. 5 embodiment is substantially the same as that in the FIG. 1 embodiment, description will be made of the FIG. 5 embodiment centering on the different portions. The correction control signal output from the filter 23 is applied to the count control 17'. The counter 16 is implemented by an up/down counter 16 in the embodiment shown. The count output of the up/down counter 16 is applied to a bypass control 50 as well as the memory 8. The output of the memory 8 is also applied to the bypass control 50. The output of the bypass control 50 is applied to the up/down counter 16 as well as the digital/analog converting circuit 11. The bypass control 50 is structured to normally allow the output of the up/down counter 16 to pass therethrough but is responsive to a bypass disable signal to allow the output of the memory 8 to pass therethrough. On the other hand, the up/down counter 16 is structured such that the same is responsive to a preset enable signal to be enabled to load therein the output of the bypass control 50. Such bypass disable signal and preset enable signal are obtained from the addressing circuit 8' responsive to the rise of the button depression of the selection switch 9.

In operation in the channel select mode, the bypass disable signal and the preset enable signal are generated by the addressing circuit 8' only at the beginning of depression of any one of push-buttons of the selection switch 9 and the bypass control 50 is switched to allow the output of the memory 8 to pass therethrough responsive to the bypass disable signal while the up/down counter 16 is enabled to load the output of the bypass control 50 therein. As a result, the output of the memory 8 is loaded or preset in the up/down counter 16 at the beginning of depression of any one of button switches of the selection switch 9. Since such bypass disable signal and preset enable signal are generated in the form of a differentiated signal, these signals are of a very short duration. After such signals become unavailable, the bypass control 50 is switched to allow the output of the up/down counter 16 to pass therethrough while the up/down counter 16 is prevented from being loaded with the output of the bypass control 50. In such a situation, the output of the up/down counter 16 is applied through the bypass control 50 to the digital/analog converting circuit 11 and is converted into an analog signal. The converted analog signal is applied through the switch circuit 12 to the voltage controlled oscillator 6 as a voltage control signal. As a result, the preset tuner establishes a reception state based on the digital data signal read out from the memory 8 and now stored in the up/down counter 16.

If and when frequency deviation occurs in the intermediate frequency signal, a correction control signal associated with the frequency deviation is obtained from the filter 23 and is applied to the count control 17'. As to be more fully described subsequently, the count control 17' is structured in the embodiment shown such that if and when the intermediate frequency signal decreases the count control 17' provides a control signal for causing the up/down counter 16 to make an upward counting operation and if and when the intermediate frequency increases the count control 17 provides a control signal for causing the up/down counter 16 to make a downward counting operation while the renewed digital data representation developed in the up/down counter 16 is applied through the bypass control 50 to the digital/analog converting circuit 11. Since the above described operation is repeated in the closed loop as described above, the up/down counter 16 is controlled to provide a proper digital data representation for causing the voltage controlled oscillator 6 to produce a signal at a predetermined local oscillation frequency and thus to cause a proper intermediate frequency.

In a preferred embodiment, an upward/downward automatic search switch 51 may be provided for the purpose of automatic searching channel selection in the upward or downward direction. The output signal from the upward/downward automatic search selection switch 51 representative of selection of upward or downward automatic search operation is applied to the count control 17'. The count control 17' is also structured such that the same is responsive to the output signal representative of the upward or downward automatic search operation to control the up/down counter 16 to make an upward or downward counting operation. The upward/downward automatic search selection switch 51 is structured such that such selection signal is obtained only during the time period when the switch 51 is depressed. Therefore, when the upward/downward automatic search selection switch 51 is released from depression, the count control 17' is not supplied with the selection signal from the selection switch 51 any more. In such a situation, the frequency comparator 22 serves to detect whether the intermediate frequency obtainable from the mixer 3 is in the proper frequency or not and the corresponding correction control signal obtainable from the filter 23 controls the count control 17', thereby to cause the up/down counter 16 to make an upward or downward counting operation, until a proper intermediate frequency is attained, when the counting operation is discontinued in the up/down counter 16 and a reception state of the corresponding channel or broadcasting station is established. If and when the upward/downward automatic search selection switch 51 is depressed again, the above described operation is repeated.

In operation of the write-in mode by the FIG. 5 embodiment, a write enable signal is obtained from the write-in/channel select mode selector 12' and the memory 8 is enabled. In such a situation, a desired channel or broadcasting station is selected through manual operation or automatic search channel selection as described above and the digital data representation as developed in the up/down counter 16 is loaded in the memory 8 at the address selected by the selection switch 9.

Figure 6:
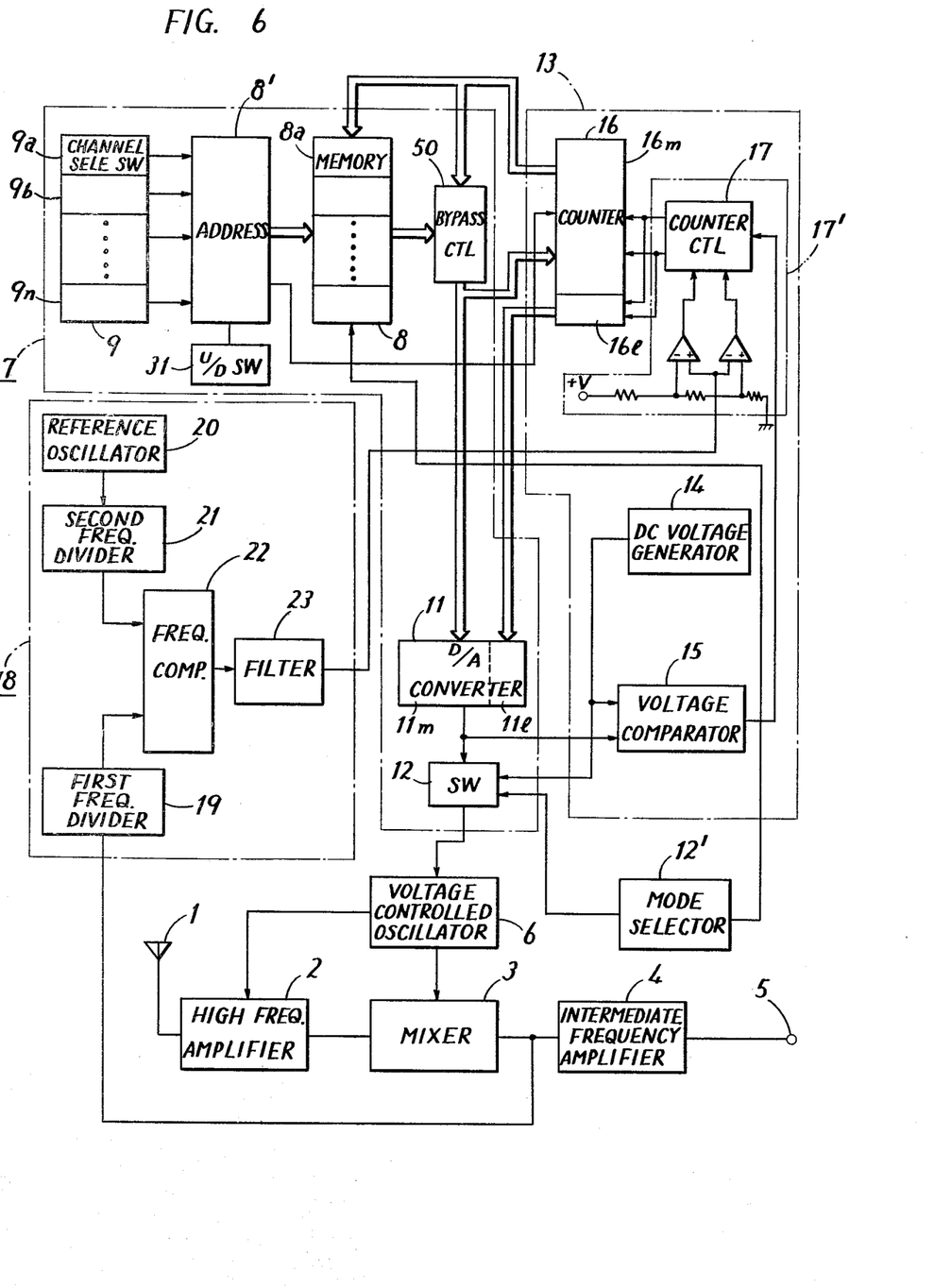
FIG. 6 is similar to FIG. 5 but shows a further embodiment of a preset tuner in accordance with the present invention.

FIG. 6 is similar to FIG. 5 but shows a further embodiment of a preset tuner in accordance with the present invention. Since the major portion of the FIG. 6 embodiment is substantially the same as that in the FIG. 5 embodiment, description will be made of the FIG. 6 embodiment centering on only the different portions. A feature to be noted in the FIG. 6 embodiment is that the up/down counter 16 and digital/analog converting circuit 11 are each divided into two portions, one for a more significant portion and the other for a less significant portion. More specifically, the up/down counter 16 comprises a more significant portion 16m and a less significant portion 16l, while the digital/analog converting circuit 11 comprises a more significant portion 11m and a less significant portion 11l. Only the output of the more significant portion 16m of the up/down counter 16 is applied to the memory 8 and the bypass control 50 and the output of the less significant portion 16l of the up/down counter 16 is applied to the less significant portion 11l of the digital/analog converting circuit 11. On the other hand, the output of the bypass control 50 is applied to the more significant portion 16m of the up/down counter 16 and the more significant portion 11m of the digital/analog converting circuit 11.

In view of the above described circuit configuration, the number of bits in each address in the memory 8 is selected to be the same as that in the more significant portion 16m in the up/down counter 16 and that in the more significant portion 11m in the digital/analog converting circuit 11. The less significant portion 16l of the up/down counter 16 and the less significant portion 11l of the digital/analog converting circuit 11 are adapted to be of the same number of bits. By way of an example, the number of bits in each address in the memory 8 and in the more significant portion 16m in the up/down counter 16 and in the more significant portion 11m in the digital/analog converter 11 is selected to be 10 bits, while the number of bits in the less significant portion 16l in the up/down counter 16 and in the less significant portion 11l in the digital/analog converting circuit 11 is selected to be 3 bits.

The operation of the FIG. 6 embodiment is similar to that of the FIG. 5 embodiment, except for the following. As far as the operation in conjunction with the more significant portions in the up/down counter 16 and the digital/analog converting circuit 11 is concerned, substantially the same operation is carried out as described in conjunction with the FIG. 5 embodiment. However, according to the FIG. 6 embodiment, the operation for correcting a frequency deviation is mainly carried out in conjunction with the less significant portions 16l and 11l in the up/down counter 16 and the digital/analog converting circuit 11. Nevertheless, since the more and less significant portions in the up/down counter 16 and the digital/analog converting circuit 11 constitute the single up/down counter 16 and the single digital/analog converting circuit 11, a carry over occurs from the less significant portions to the more significant portions in the up/down counter 16 and the digital/analog converting circuit 11 if and when the data processed in the less significant portions becomes large to exceed a limit for the less significant portions. According to the FIG. 6 embodiment as described above, approximately twenty percent of the bit positions can be saved at the sacrifice of the provision of the less significant portions in the up/down ounter 16 and the digital/analog converting circuit 11. If and when a memory of a capacity without the above described decrease is utilized as the memory 8, then precision can be remarkably enhanced only by additional provision of the less significant portions in the up/down counter 16 and the digital/analog converting circuit 11.

Figure 7:
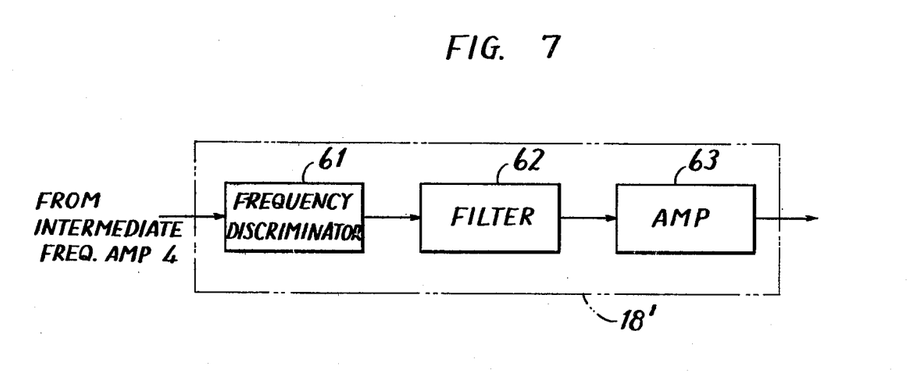
FIG. 7 shows a block diagram of another embodiment of the correcting circuit.

FIG. 7 shows a blcok diagram of another embodiment of the correction circuit 18. The correction circuit 18' shown comprises a frequency discriminator 61 coupled to receive the output of the intermediate frequency amplifier 4 for discriminating the frequency deviation from the intermediate frequency, a filter 62 for filtering the output of the frequency discriminator 61 and an amplifier 63 for amplifying the output of the filter 62. The output of the amplifer 63 may be utilized as a correction control signal to be applied to the digital/analog converting circuit 11 described with reference to FIGS. 1 and 4 or to be applied to the count control 17' described with reference to FIGS. 5 and 6. If and when the inventive preset tuner is employed in an FM receiver, a frequency demodulator for use in FM reception can be utilized as the frequency discriminator 61.

Figure 8:
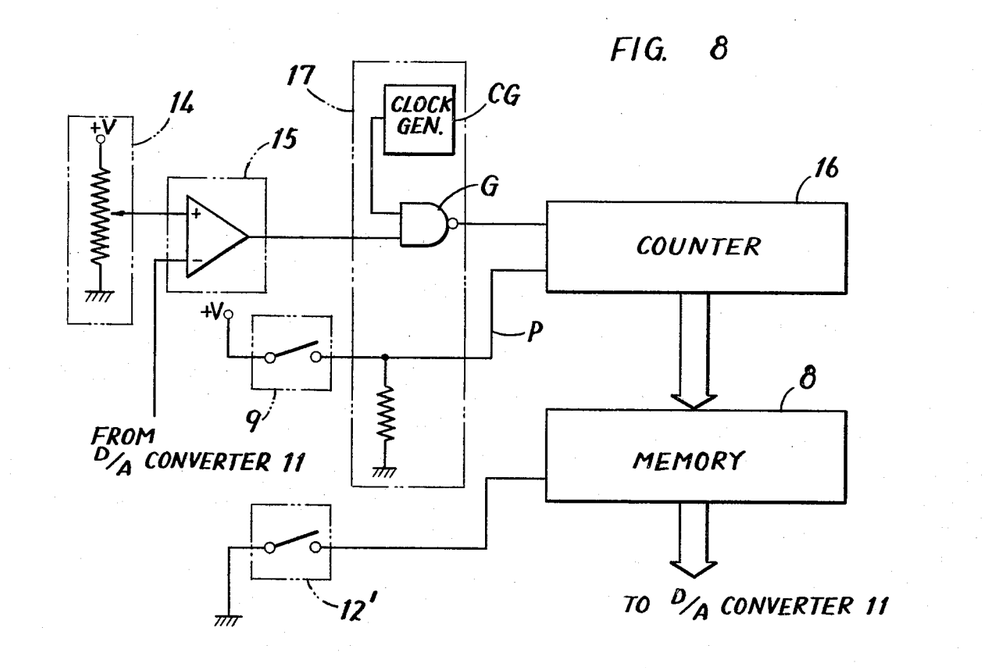
FIG. 8 shows a block diagram of one embodiment of the write-in circuit employed in the FIG. 1 embodiment.

FIG. 8 shows a block diagram of one embodiment of the write-in circuit 13. Referring to FIG. 8, the variable direct current voltage generator 14 is shown as implemented by a variable resistor coupled between a voltage supply and the ground. The voltage comparator 15 is shown implemented by a typical differential amplifier. The counter 16 may comprise a typical straight binary counter. The counter 16 is shown having a clock input terminal CL and a reset signal input R. The count control 17 is shown comprising a clock pulse generator CG, a logical gate connected to be responsive to the output of the comparator 15 for allowing clock pulses to pass therethrough to the clock input terminal CL of the counter 16 and a transfer path P for transferring a reset signal generated at the beginning of depression of the selection switch 9. Referring to FIG. 8, the write-in/channel select mode selector 12' is also shown as implemented by a switch, wherein closing thereof represents the write-in mode while opening thereof represents the channel select mode and output of the switch when the same is closed is applied to the memory 8 as a write enable signal.

Figure 9:
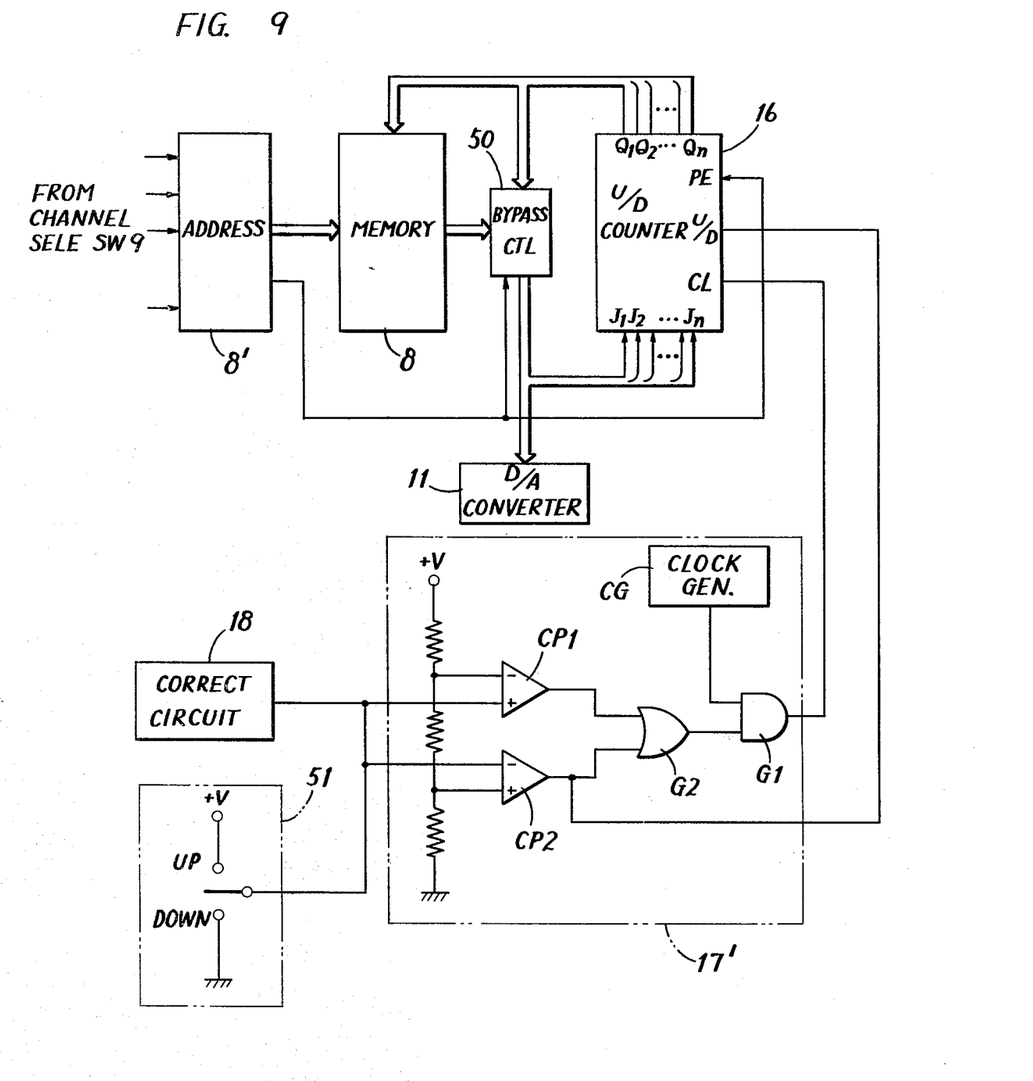
FIG. 9 shows a block diagram of the write-in circuit employed in the FIG. 5 embodiment.

FIG. 9 shows a block diagram of one embodiment of the write-in circuit 13 emloyed in the FIG. 5 embodiment. Referring to FIG. 9, the counter 16 is structured such that the same normally provides a digital data representation output from the output terminals Q1, Q2, Q3, ... Qn but is loaded, as an inital value, with a digital data representation input received at the input J1, J2, J3, ... Jn as a function of a preset enable signal received from the addressing circuit 8'. The counter 16 is further structured such that the same makes a counting operation as a function of clock signals received at the clock input CL and the direction of the counting operation is controlled as a function of an upward/downward control signal received at the upward/downward control input U/D. The count control 17' is shown comprising a clock pulse generator CG and an AND gate G1 for allowing the clock pulses to pass therethrough as a function of the output from a preceding stage OR gate G2. The OR gate G2 is connected to receive the outputs of a first and second voltage comparators CP1 and CP2. The plus input of the first voltage comparator CP1 and the minus input of the second voltage comparator CP2 are connected to receive the correction control signal output of the correction control signal generator 18. The minus input of the voltage comparator C1 is connected to receive a relatively high reference voltage and the plus input of the second voltage comparator CP2 is connected to receive a relatively low reference voltage. Referring to FIG. 9, the upward/downward automatic search selection switch 51 is shown as implemented by a switch, wherein an upward terminal UP is connected to a positive voltage source and a downward terminal DOWN is connected to the ground while a common terminal is connected to the plus input of the first voltage comparator CP1 and the minus input of the second voltage comparator CP2.

In operation, if and when the correction control signal from the correction control signal generator 18 exceeds a relatively high reference voltage for the first voltage comparator CP1, the comparator CP1 provides the logic one output, which enables the gate G1 to pass the clock pulses therethrough. Since the clock pulses are applied to the counter 16, the counter 16 makes a counting operation. Since the upward/downward control signal obtained from the second voltage comparator CP2 is the low level in such a situation, the counter 16 is controlled to make a counting operation in the downward direction. If and when the correction control signal from the correction control signal generator 18 becomes lower than the predetermined relatively low reference voltage for the second voltage comparator CP2, the comparator CP2 provides the logic one output, which enables the gate G1 to pass the clock pulses therethrough. Since the upward/downward selection signal from the second voltage comparator CP2 is the high level in such a situation, the counter 16 is controlled to make a counting operation in the upward direction. If and when the correction control signal from the correction control signal generator 18 is within the range defined by the relatively high reference voltage and the relatively low reference voltage, no output is obtained from either the first voltage comparator CP1 or the second voltage comparator CP2. As a result, the counter 16 remains unchanged. If and when the switch 51 is turned to the upward terminal UP, the output from the switch 51 of the positive voltage level serves as if the correction control signal from the correction control signal generator 18 exceeds the relatively high reference voltage, as described previously. On the other hand, if the switch 51 is turned to the downward terminal DOWN, the output from the switch 51 of the ground level serves as if the correction control signal from the correction control signal generator 18 becomes lower than the predetermined relatively low reference voltage. As a result, selective operation of the switch 51 causes a so-called automatic searching channel selection in a desired upward or downward direction.

Figure 10:
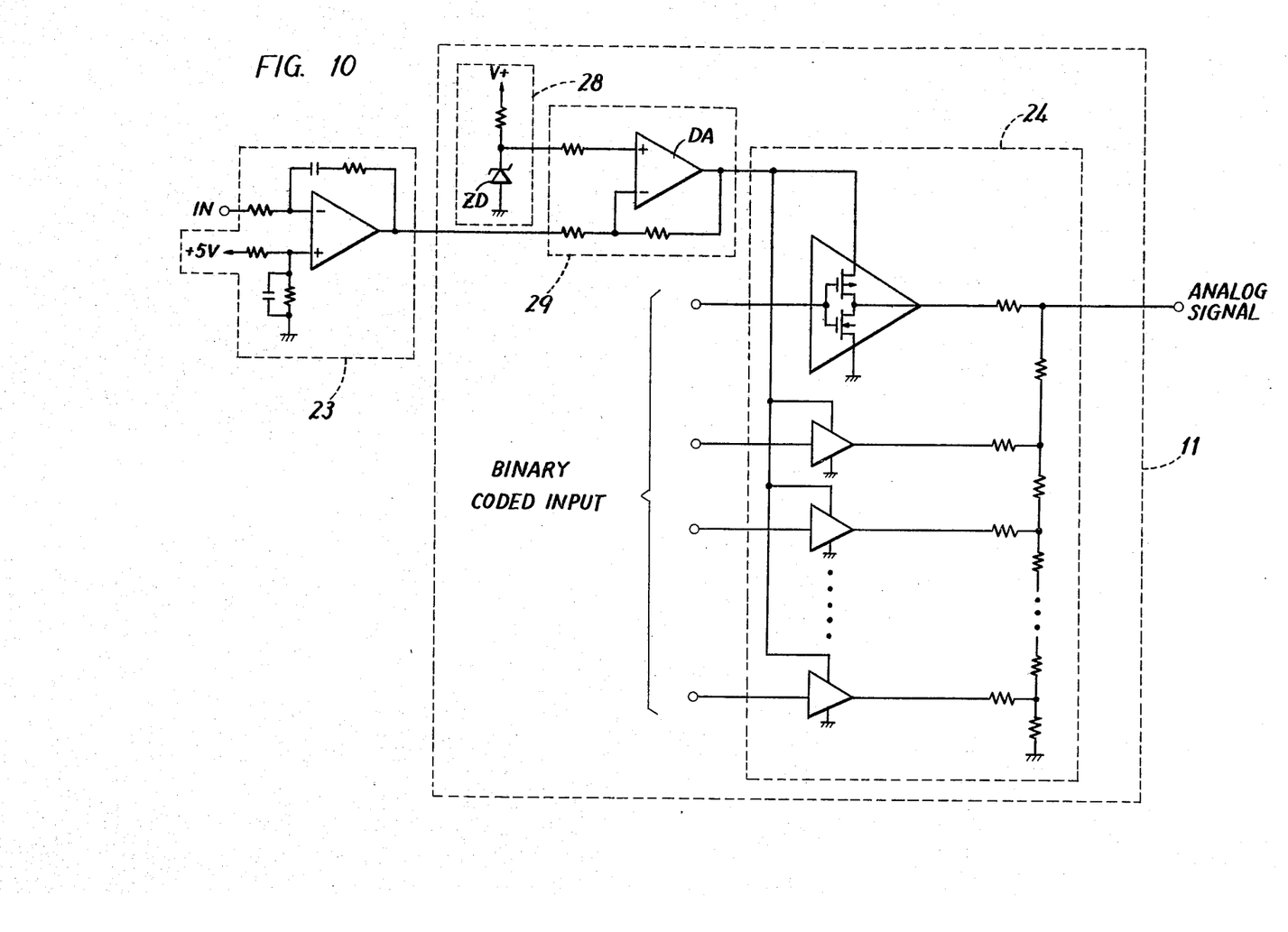
FIG. 10 is a block diagram showing in more detail the FIG. 2 embodiment.

FIG. 10 is a block diagram showing in more detail the FIG. 2 embodiment. Referring to FIG. 10, the reference voltage source 28 is implemented by a Zener diode ZD and the correction control circuit 29 comprises a differential amplifier connected to receive the output of the reference voltage source 28 at the plus input thereof and to receive the output of the filter 23 at the input terminal thereof. As a result, the differential amplifier DA serves to provide an output which is associated with the reference voltage of the output from the reference voltage source 28 but is modified as a function of the correction signal output from the filter 23. The digital/analog converter 24 is shown comprising a plurality of switching devices arranged in parallel such that the input terminals thereof constitute a binary coded input for receiving the digital data representation signal from the memory 8 while the outputs of these switching devices are connected to a resistor matrix for composing the outputs of the switching devices to provide a composed analog signal. These switching devices are each connected between the output of the differential amplifier DA and the ground. Since the output of the differential amplifier is variable as a function of the correction control signal from the filter 23, the analog signal output of the digital/analog converter 24 is also controlled to be variable as a function of the correction control signal from the filter 23.

Figure 11:
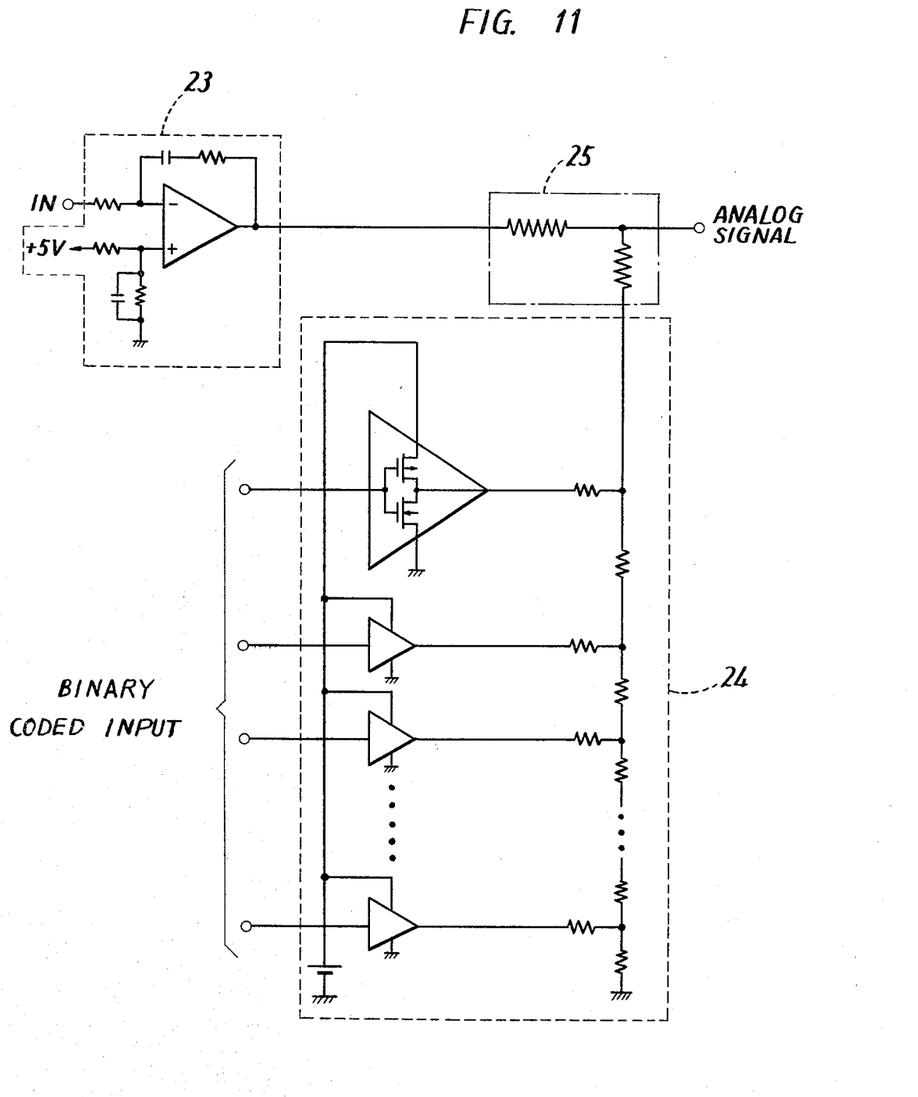
FIG. 11 is a block diagram showing in more detail the FIG. 3 embodiment.

FIG. 11 is a block diagram showing in more detail the FIG. 3 embodiment. In the embodiment shown in FIG. 11, the switching devices of the digital/analog converter 24 are connected between a fixed voltage source and the ground. Instead, the analog output of the digital/analog converter 24 is applied to an adder 25 which comprises a well known resistor matrix adder. The adder 25 serves to add the correction control signal from the filter 23 to the analog output signal from the digital/analog converter 24, thereby to provide a corrected or compensated analog signal.

Figure 12:
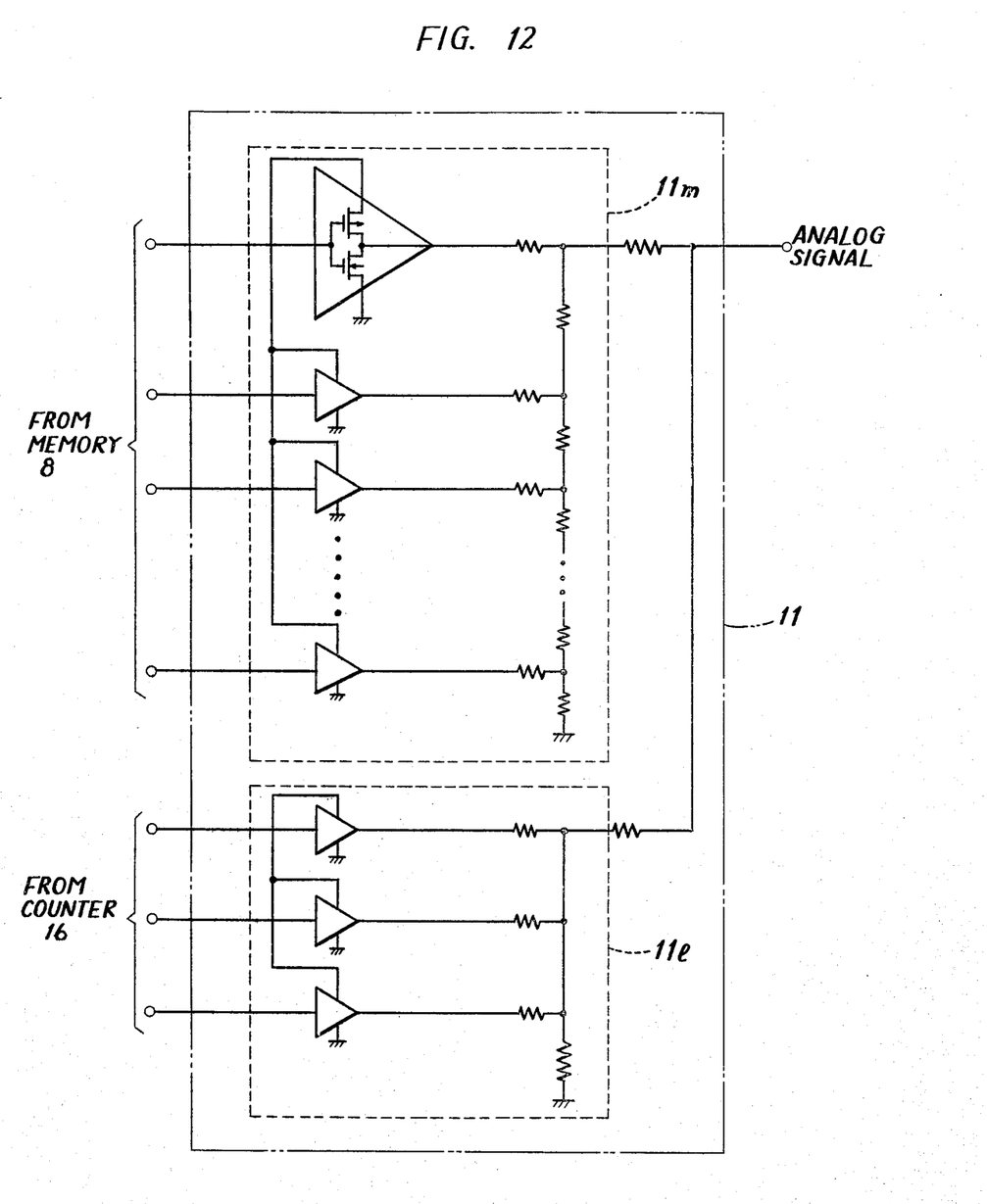
FIG. 12 is a block diagram showing in more detail the digital/analaog converting circuit shown in FIG. 6.

FIG. 12 is a block diagram showing in more detail, the digital/analog converting circuit 11 shown in FIG. 6. It is recalled that the digital/analog converting circuit 11 of the FIG. 6 embodiment comprises the more significant portion 11m and the less significant portion 11l. Referring to FIG. 12, the more and less significant portions 11m and 11l are implemented separately but the outputs of these more and less significant portions 11m and 11l are combined by a well known resistor matrix adder to provide a single analog output.

Although the present invention has been described and illustrated in detail, it is to be clearly understood that the same is by way of illustration and example only and is not to be taken by way of limitation, the spirit and scope of the present invention being limited only by the terms of appended claims.

What is claimed is:

1. A preset tuner adapted for selecting a desired one out of a plurality of preset channels, comprising:
    storage means for storing a plurality of digital data representations each associated with one of said plurality of preset channels,
    means coupled to said storage means for providing to said storage means said digital data representations,
    means coupled to said storage means for selectively reading a desired one of said plurality of digital data representations from said storage means,
    means coupled to said reading means for converting said selectively read digital data representation into a first analog signal representative of said read digital data representation,
    voltage controlled oscillator means coupled to said converting means for producing an oscillation signal at a frequency as controlled by said first analog signal,
    said digital data representation providing means including:
        signal generator means for generating a first signal commensurate with a voltage control signal for said voltage controlled oscillator means for producing an oscillation signal at a frequency corresponding to the local oscillation frequency of a desired channel, and
        means coupled to said storage means for generating a digital data representation associated with said first signal from said signal generator means,
    means for selecting a presetting mode and a channel selecting mode,
    switching means coupled to said mode selecting means for providing said first signal from said signal generator means in said presetting mode and providing said first analog signal from said converting means and to said voltage controlled oscillator means in said channel selecting mode,
    means for receiving a high frequency signal,
    mixer means coupled to said high frequency signal receiving means and said voltage controlled oscillator means for mixing said received high frequency signal and the oscillation signal from said voltage controlled oscillator means for providing an intermediate frequency signal,
    means coupled to said storage means responsive to said intermediate frequency signal for detecting frequency deviation of said intermediate frequency signal for producing a signal representative of frequency deviation of said intermediate frequency signal, and
    means coupled to said frequency deviation signal producing means and responsive to said frequency deviation signal for compensating said converted first analog signal to correct the frequency deviation of said intermediate frequency signal.

2. A preset tuner in accordance with claim 1, wherein said frequency deviation detecting means comprises
    reference oscillator means for providing a reference frequency signal having a predetermined reference frequency, and
    frequency comparator means coupled to said reference oscillator means and said mixer means for comparing the frequencies of said reference frequency signal and said intermediate frequency signal for providing a correction control signal to said converting means.

3. A present tuner in accordance with claim 1, wherein said frequency deviation detecting means comprises frequency discriminator means for detecting the frequency deviation of said intermediate frequency signal.

4. A preset tuner in accordance with claim 1, which further comprises addressing means coupled to said storage means for addressing said storage means.

5. A present tuner in accordance with claim 1, which further comprises
    means coupled to said mode selecting means for loading said digital data representation generated in said digital data representation generating means into said storage means in said presetting mode.

6. A preset tuner in accordance with claim 1, wherein said first signal produced by said signal generator means is a variable voltage, said signal generator means including variable direct current voltage generator means for generating the variable direct current voltage.

7. A preset tuner in accordance with claim 6, wherein said digital data representation providing means further comprises
    means coupled to said variable direct current voltage generator means and said converting means for comparing the voltage from said variable direct current voltage generator means and the voltage from said converting means, and
    means responsive to the output from said voltage comparing means for controlling said digital data representation generating means.

8. A preset tuner in accordance with claim 1, wherein said converting means includes means for converting the digital data representation generated by said digital data representation generating means into a second analog signal.

9. A preset tuner in accordance with claim 8, wherein said digital data representation generating means comprises means for controlling generation of said digital data representation.

10. A preset tuner in accordance with claim 8, wherein said switching means comprises a switch for providing said digital data representation generated by said digital data representation generating means to said converting means in said presetting mode and providing said digital data representation read out from said storage means to said converting means in said channel selecting mode.

11. A preset tuner in accordance with claim 1, wherein said digital data representation generating means comprises counter means.

12. A preset tuner in accordance with claim 11, wherein said counter means comprises up/down counter means and up/down count control means.

13. A preset tuner in accordance with claim 1, wherein said first analog signal of said converting means is controllable as a function of a correction control signal from said compensation means.

14. A preset tuner in accordance with claim 13, wherein said converting means further comprises adder means responsive to said correction control signal for compensating said first analog signal.

15. A preset tuner in accordance with claim 1, which further comprises means for holding the digital data representation read from said storage means and supplying the digital data representation held therein to said converting means, and wherein said compensating means comprises means responsive to said frequency deviation signal for correcting the digital data representation held in said digital data representation holding means for compensating said converted analog signal.

16. A preset tuner in accordance with claim 15, wherein said digital data representation holding means comprises an up/down counter.

17. A preset tuner in accordance with claim 15, wherein said digital data representation holding means comprises
- a more significant portion for receiving the digital data representation read from said storage means, and
- a less significant portion, and said first analog signal converting means comprises
- a more significant portion, and
- a less significant portion,
- said more significant portion of said digital data representation holding means being coupled to said more significant portion of said converting means and said less significant portion of said digital data representation holding means being coupled to said less significant portion of said converting means.

18. A preset tuner in accordance with claim 16, wherein said digital data representation providing means comprises an up/down counter, said up/down counter of said digital data representation holding means being utilized as said up/down counter of said digital data representation providing means.

19. Apparatus as in claim 1 further comprising addressing means coupled to said storage means for addressing a desired location of said storage means.

20. A preset tuner in accordance with claim 19, wherein said addressing means comprises sequential addressing means.

21. A preset tuner in accordance with claim 20, wherein said sequential addressing means comprises up/down control means.

22. A preset tuner in accordance with claim 1, wherein said digital data representation generating means comprises
- an up/down counter responsive to said signal representative of the frequency deviation for making a corrective counting operation as a function of said signal,
- said converter means being responsive to said up/down counter for converting the count value of said up/down counter into said first analog signal.

* * * * *